(12) United States Patent
Palm et al.

(10) Patent No.: US 9,553,051 B2
(45) Date of Patent: Jan. 24, 2017

(54) ELECTRONIC COMPONENT

(71) Applicant: Infineon Technologies Austria AG, Villach (AT)

(72) Inventors: Petteri Palm, Regensburg (DE); Holger Torwesten, Regensburg (DE); Manfred Schindler, Regensburg (DE); Boris Plikat, Tegernheim (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/611,676

(22) Filed: Feb. 2, 2015

(65) Prior Publication Data
US 2016/0225717 A1    Aug. 4, 2016

(51) Int. Cl.
  *H01L 21/44*    (2006.01)
  *H01L 23/538*   (2006.01)
  *H01L 21/48*    (2006.01)
  *H01L 23/31*    (2006.01)
  *H01L 21/56*    (2006.01)

(52) U.S. Cl.
  CPC ....... *H01L 23/5389* (2013.01); *H01L 21/4857* (2013.01); *H01L 21/56* (2013.01); *H01L 23/3107* (2013.01); *H01L 23/5383* (2013.01); *H01L 23/5386* (2013.01)

(58) Field of Classification Search
  CPC ............. H01L 21/762; H01L 21/02241; H01L 21/467; H01L 21/475; H01L 21/048; H01L 21/3226; H01L 21/28079; H01L 23/53233; H01L 23/53219; H01L 27/1104; H01L 29/435; H01L 51/102; H01L 51/0508
  USPC ....... 438/197, 687, 688, 381, 604, 672, 673; 257/288, 350, 774, E21.006, E21.023, 257/E21.051, E21.122, E21.126, E21.127, 257/E21.231, E21.347, E21.399, E21.407, 257/E21.421, E21.435
  See application file for complete search history.

(56) References Cited

U.S. PATENT DOCUMENTS

| | | | | |
|---|---|---|---|---|
| 6,806,428 | B1* | 10/2004 | Kimura | H01L 23/5383 174/260 |
| 6,879,493 | B2* | 4/2005 | Kimura | H01L 23/5383 361/763 |
| 7,421,781 | B2* | 9/2008 | Kimura | H01L 23/5383 29/841 |
| 2008/0298023 | A1* | 12/2008 | Okimoto | H05K 1/183 361/715 |
| 2016/0007470 | A1* | 1/2016 | Standing | H01L 23/481 361/761 |

OTHER PUBLICATIONS

Manessis, et al., "Technical Understanding of Resin-Coated-Copper (RCC) Lamination Processes for Realization of Reliable Chip Embedding Technologies", 2007 Electronic Components and Technology Conference; Microperipheric Research Center, Technical University Berlin (TUB); Fraunhofer Institute for Reliability and Microintegration (IZM), 2007.

* cited by examiner

*Primary Examiner* — David Nhu
(74) *Attorney, Agent, or Firm* — Muphy, Bilak & Homiller, PLLC

(57) ABSTRACT

In an embodiment, an electronic component includes a dielectric layer having a first surface and a second surface, one or more semiconductor dies embedded in the dielectric layer and at least one electrically conductive member. The electrically conductive member includes a first portion and a second portion. The first portion includes a foil including a first metal and the second portion includes an electrodeposited layer including a second metal. The first portion and the second portion are embedded in the dielectric layer.

20 Claims, 9 Drawing Sheets

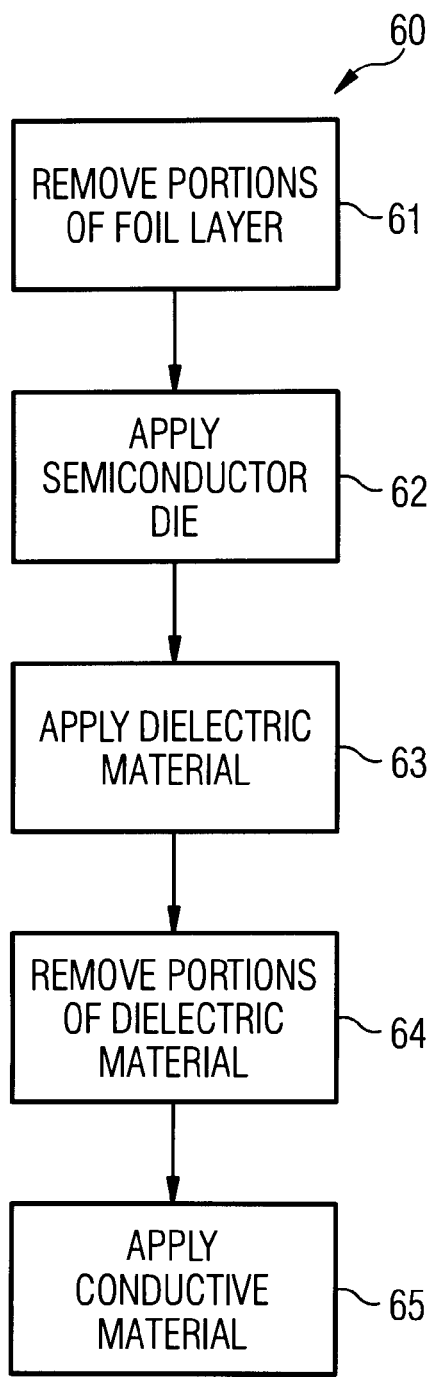
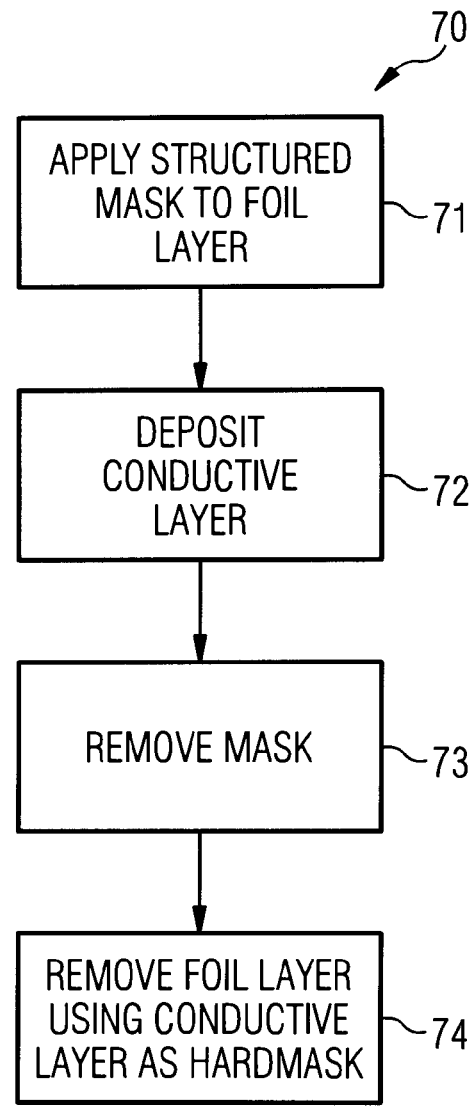

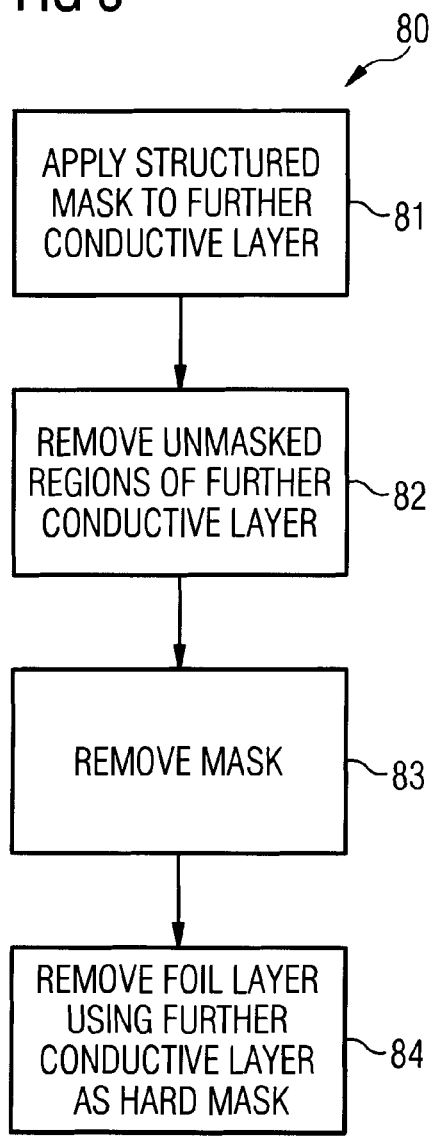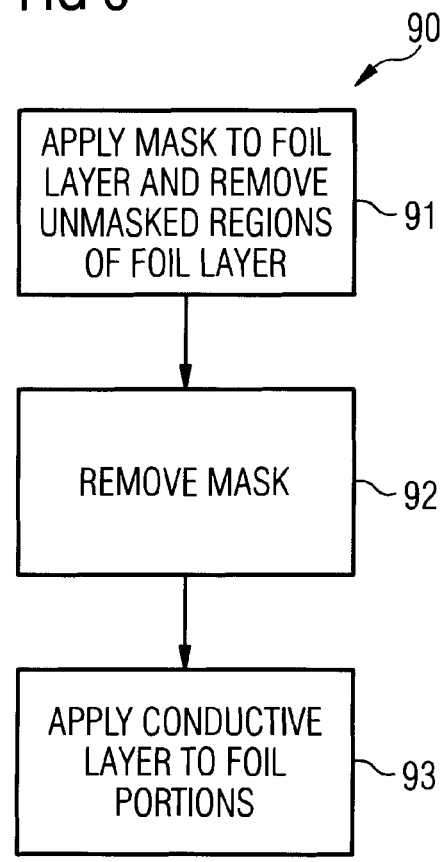

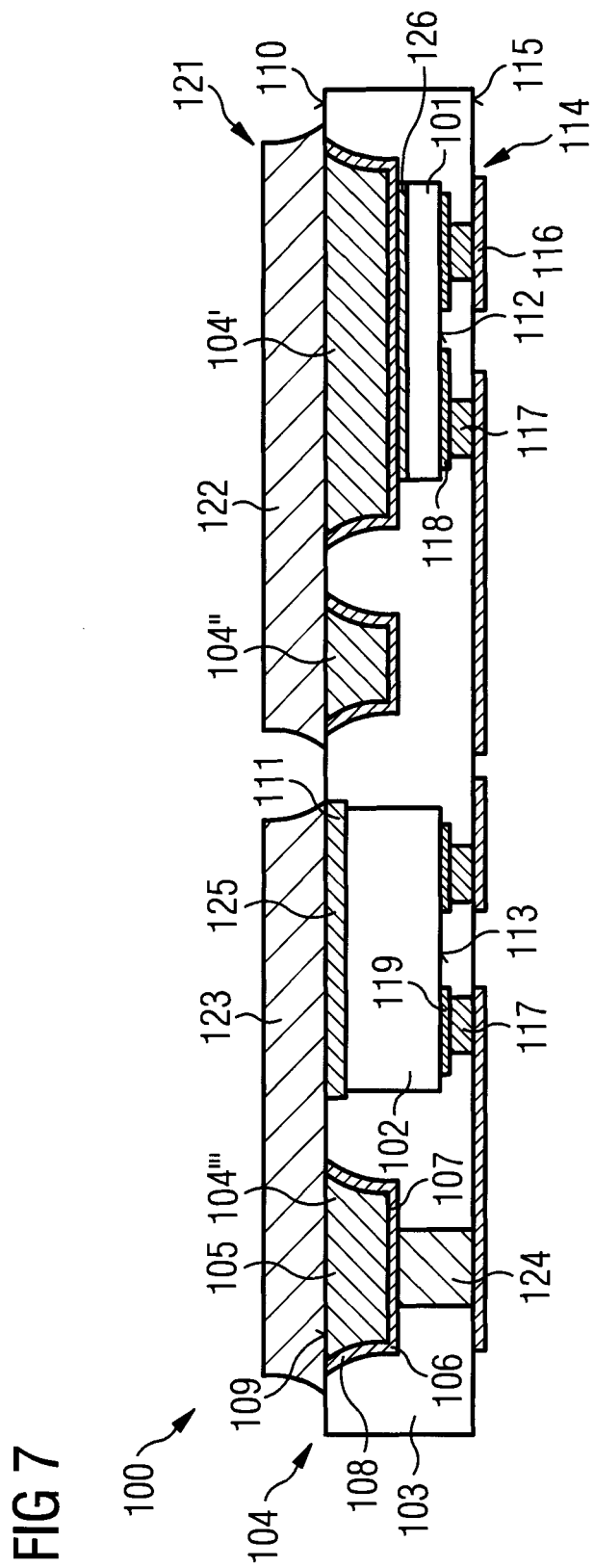

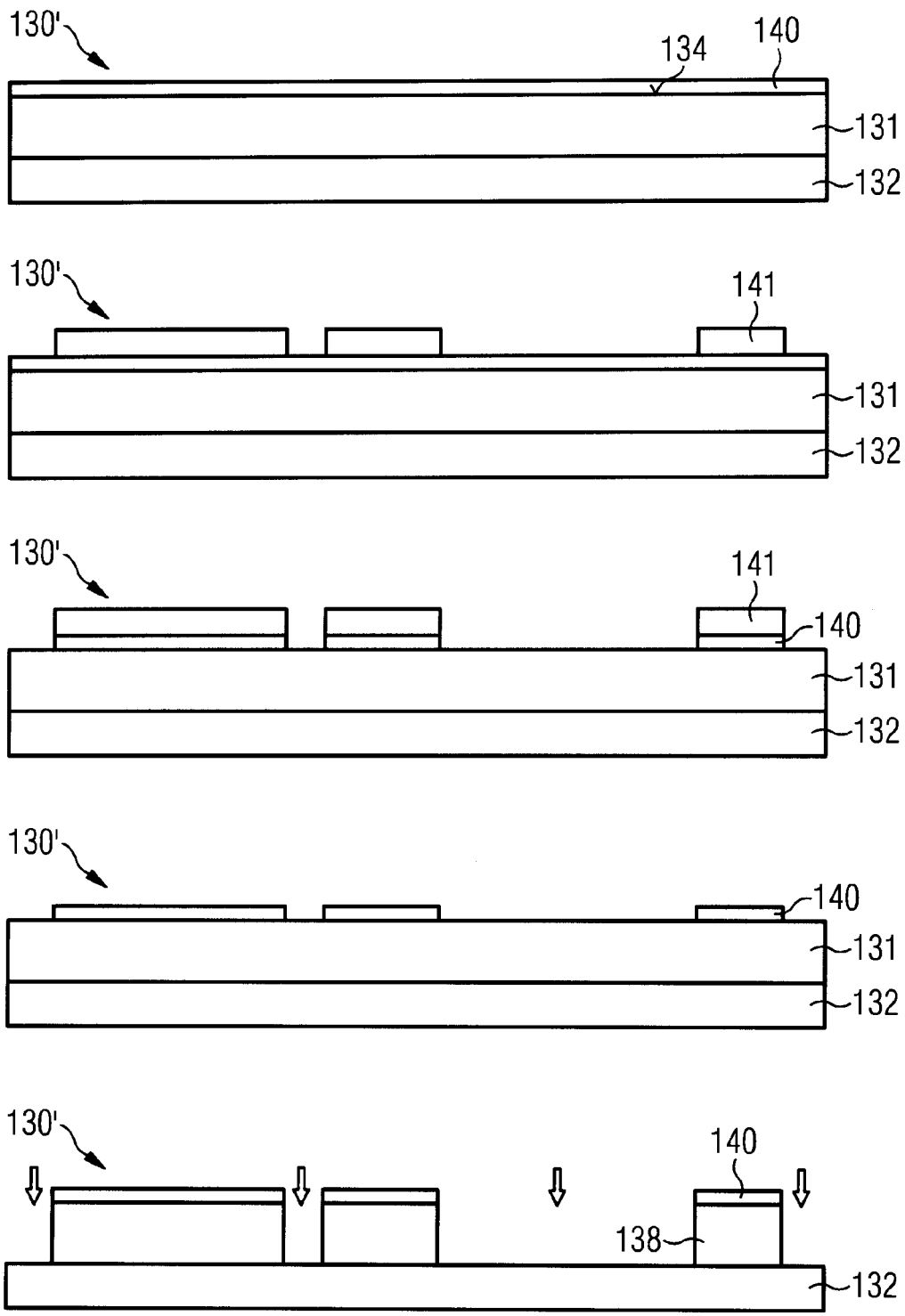

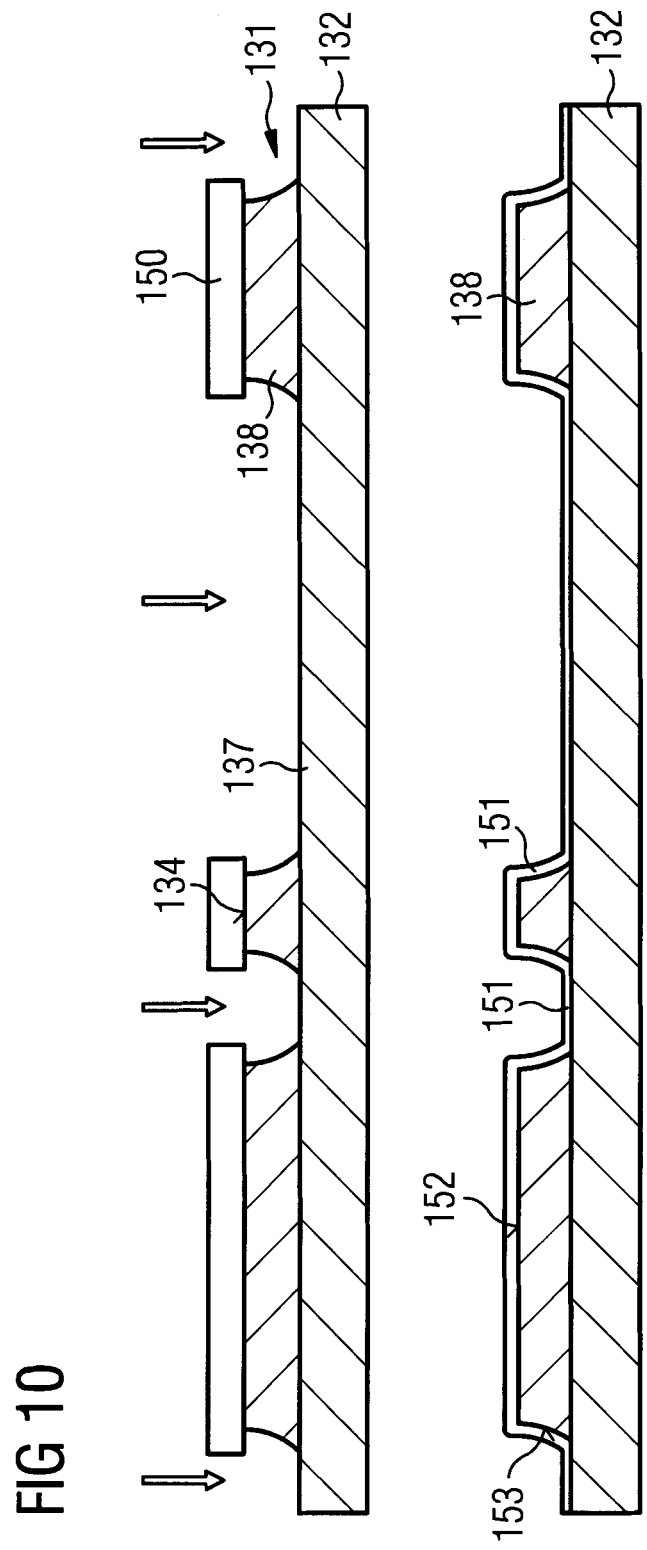

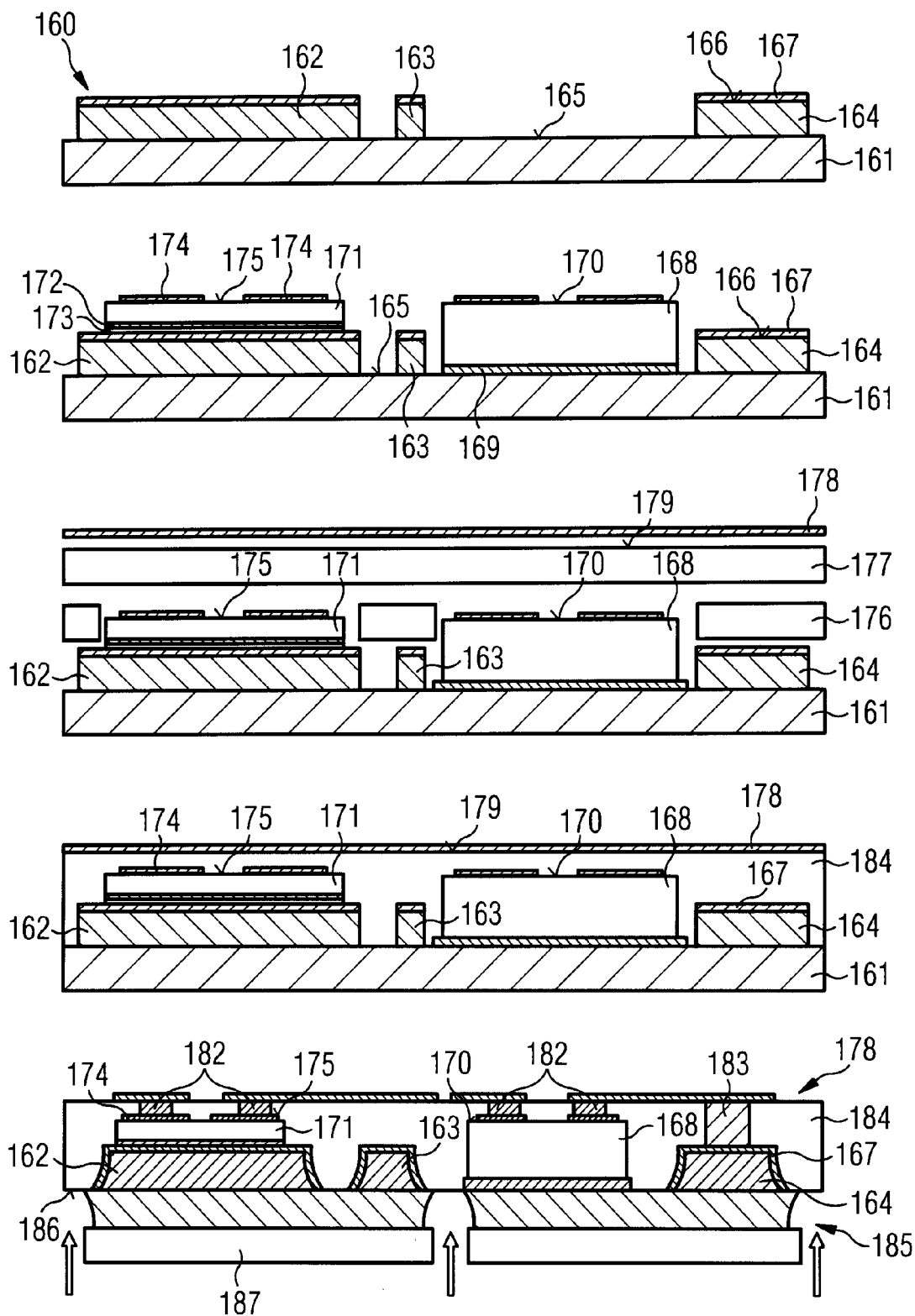

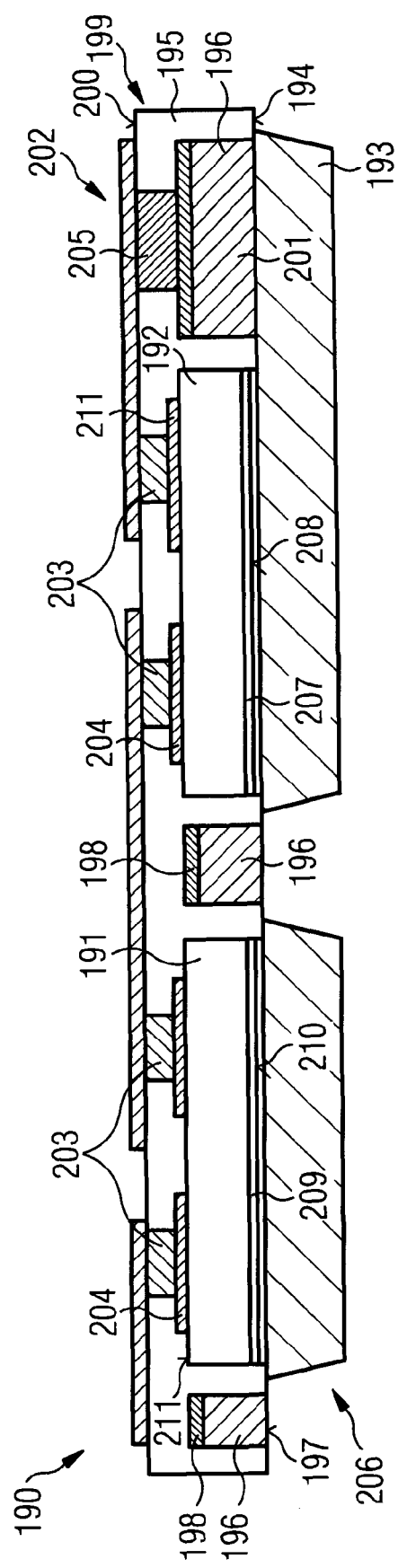

ELECTRONIC COMPONENT

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections. The housing may include a plastic material such as an epoxy resin.

SUMMARY

In an embodiment, an electronic component includes a dielectric layer comprising a first surface and a second surface, one or more semiconductor dies embedded in the dielectric layer and at least one electrically conductive member. The electrically conductive member includes a first portion and a second portion. The first portion includes a foil including a first metal and the second portion includes an electrodeposited layer including a second metal. The first portion and the second portion are embedded in the dielectric layer.

In an embodiment, a method includes selectively removing portions of a foil layer of a multilayer substrate, the substrate including the foil layer including a first metal and an electrodeposited layer including a second metal, arranging at least one semiconductor die on the multilayer substrate, applying dielectric material onto the substrate and embedding the semiconductor die and the foil layer in the dielectric material, removing portions of the dielectric material and exposing at least one contact pad of the semiconductor die and a region of the foil layer adjacent a depression in the foil layer, and applying conductive material to the contact pad and the region of the metal foil.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3 illustrates a flow diagram of a method of fabricating an electronic component.

FIG. 4 illustrates a flow diagram of a method for fabricating a substrate for an electronic component according to an embodiment.

FIG. 5 illustrates a flow diagram of a method of fabricating a substrate for an electronic component according to an embodiment.

FIG. 6 illustrates flow diagram of a method of fabricating a substrate for an electronic component according to an embodiment.

FIG. 7 illustrates an electronic component according to an embodiment.

FIG. 9 illustrates a method of fabricating a substrate for an electronic component according to an embodiment.

FIG. 10 illustrates a method of fabricating an electronic component according to an embodiment.

FIG. 11 illustrates a method of fabricating an electronic component according to an embodiment.

FIG. 12 illustrates a method of fabricating an electronic component according to an embodiment.

DETAILED DESCRIPTION

Figure 1:
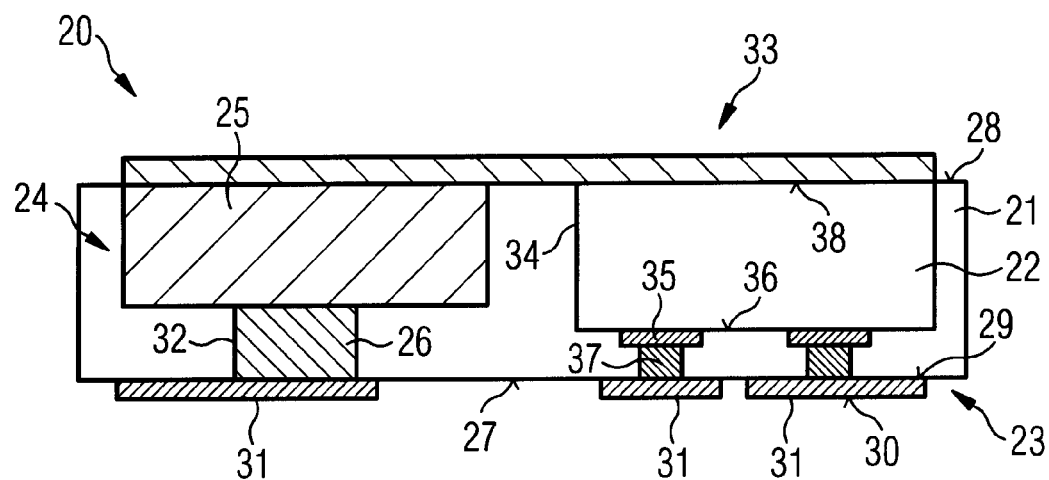
FIG. 1 illustrates an electronic component according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figures being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. And enhancement-mode device, such as a low-voltage enhancement-mode transistor, has a positive threshold voltage which means that it cannot conduct current at zero gate voltage and is normally off.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1 illustrates an electronic component 20 according to a first embodiment. The electronic component 20 includes a dielectric layer 21, a semiconductor die 22 embedded in the dielectric layer 21, a first conductive redistribution layer 23 and at least one electrically conductive member 24 including a first portion 25 and a second portion 26. The dielectric layer 21 includes a first surface 27 and a second surface 28 which opposes the first surface. The first conductive redistribution layer 23 includes a first surface 29 arranged on the first surface 27 of the dielectric layer 21 and a second surface 30, the second surface opposing the first surface 29. The second surface 30 of the first conductive redistribution layer 23 provides at least one outer contact pad 31 of the electronic component 20. A solder bump or deposit may be arranged on the outer contact pads 31 to provide outer contacts. The solder bump or deposit may be used to mount and electrically connect the electronic component 20 to a printed circuit board. The first conductive redistribution layer may include a metal in the form of a foil or an electrodeposited layer.

The first portion 25 of the electrically conductive member 24 includes a foil including a first metal. The second portion 26 of the electrically conductive member 24 includes an electrodeposited layer 32 including a second metal. The second metal is different from the first metal. The first portion 25 and the second portion 26 of the electrically conductive member 24 are embedded within the dielectric layer 21. In this particular embodiment, the electrodeposited layer 32 forms a conductive via.

The electronic component 20 further includes a second redistribution layer 33 which is arranged on the second surface 28 of the dielectric layer 22. The second conductive redistribution layer 33 may include an electrodeposited layer and may include the same metal as the second portion 26 of the electrically conductive member 24 and a different metal to the first portion 25 of the electrically conductive member 24.

As used herein, a metal includes compositions including a single element such as Cu or Al and an alloy including two or more elements.

The first metal and the second metal may be selected such that they are selectively etchable by wet etching. In some embodiments, the composition of the first metal and second metal are selected such that, for a particular etch, selective etching removes the material of the foil at a faster rate than the material of the electrodeposited layer or vice versa. The difference in the etching rate may be in the range of 1.5:1 to 100:1. In some embodiments, an etch stop is provided at the interface between the first metal and the second metal, for example between the foil, i.e. the first portion 25 of the electrically conductive member 24, and the second conductive redistribution layer 33.

An etching solution including sodium hydroxide, for example 50 to 70 g/l of NaOH may be used to etch an aluminium foil. For this particular solution, the etching may be carried out at approximately 70° C.

The first portion 25 of the electrically conductive member 24 includes a foil including a first metal. The foil may have a thickness of 20 µm to 1 mm. In some embodiments, the foil may have a thickness of 20 µm to 200 µm or 30 µm to 100 µm. The second portion 26 includes an electrodeposited layer 32 including a second metal, which is different from the first metal. The electrodeposited layer may have a thickness of 1 µm to 100 µm, or 2 µm to 85 µm.

For example, the first portion 25 may be provided by aluminium foil and the second portion 26 may include copper. The second conductive redistribution layer 33 may include an electrodeposited copper layer. The first conductive redistribution layer 23 may include copper in the form of a copper foil.

A multilayer substrate including an aluminium foil having a thickness of 20 µm to 200 µm with an electrodeposited copper layer having a thickness of 2 µm to 85 µm may be used. In some embodiments, the aluminium foil may have a thickness of 30 µm to 40 µm and the electrodeposited copper layer a thickness of 2 µm to 9 µm. The electrodeposited copper layer may have a purity of around 99.8%.

A foil and an electrically deposited layer are each distinguished by a microstructure which is characteristic of the form of a foil and an electrically deposited layer, respectively. For example, a foil may include a surface including damage by rolls, a rolling texture or a recrystallisation texture. An electrically deposited layer may include a plurality of grains having a size and microstructure which is formed as a result of the deposition process. For example, the electrodeposited layer may include dendritic growth or a preferred growth direction.

The semiconductor die 22 may include a low-voltage device, such as a low-voltage enhancement-mode transistor, for example a power transistor device having a vertical drift path. The power transistor device may include a Field Effect Transistor (FET) such as a Metal Oxide Field Effect Transistor (MOSFET), an Insulated Gate Bipolar Transistor (IGBT) or a Bipolar Junction Transistor (BJT).

The semiconductor die 22 may include a high-voltage device, such as a high-voltage depletion-mode transistor, such as a Group III-nitride-based High Electron Mobility Transistor (HEMT).

The dielectric layer 21 may include a substantially planar prefabricated board including a material such as glassfibre reinforced matrix, or other material, which is typically used to fabricate a core layer for a printed circuit board. For example, the dielectric core layer may include a glass fibre reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example.

The dielectric layer 21 may include a resin film, which may additionally include one or more fillers. The filler may include particles, such as ceramic particles. The resin layer may be pre-formed and provided as a film or foil. In some embodiments, the resin may be formed by printing, coating or molding.

In some embodiments, such as that illustrated in FIG. 1, the electrically conductive member 24 extends throughout the thickness of the dielectric layer 21 such that the first portion 25 is arranged on, and electrically coupled to, the second redistribution layer 33 and the second portion 26 is arranged on and electrically coupled to the first redistribution layer 23. The electrically conductive member 24 electrically couples the second redistribution layer 33 with the first redistribution layer 23. The first electrically conductive member 24 is arranged adjacent to, and spaced apart from, a side face 34 of the semiconductor die 22.

The semiconductor die 22 may include one or more bond pads 35 on a first surface 36. The bond pads 35 may be electrically coupled to the first redistribution layer 23 by conductive vias 37 extending between the bond pads 35 and the first redistribution layer 23. The conductive vias 37 may be embedded within the dielectric layer 21. In the embodiment illustrated in FIG. 1, the opposing surface 38 of the semiconductor die 22 is arranged directly on a portion of the second conductive redistribution layer 33.

In some embodiments, the first conductive redistribution layer 23 is arranged directly on the bond pads 35 of the semiconductor die 22. In these embodiments, the conductive vias may be omitted.

The first conductive redistribution layer 23 is not limited to a single conductive layer and may include two or more sublayers and provide a multi-layer redistribution structure.

Figure 2:
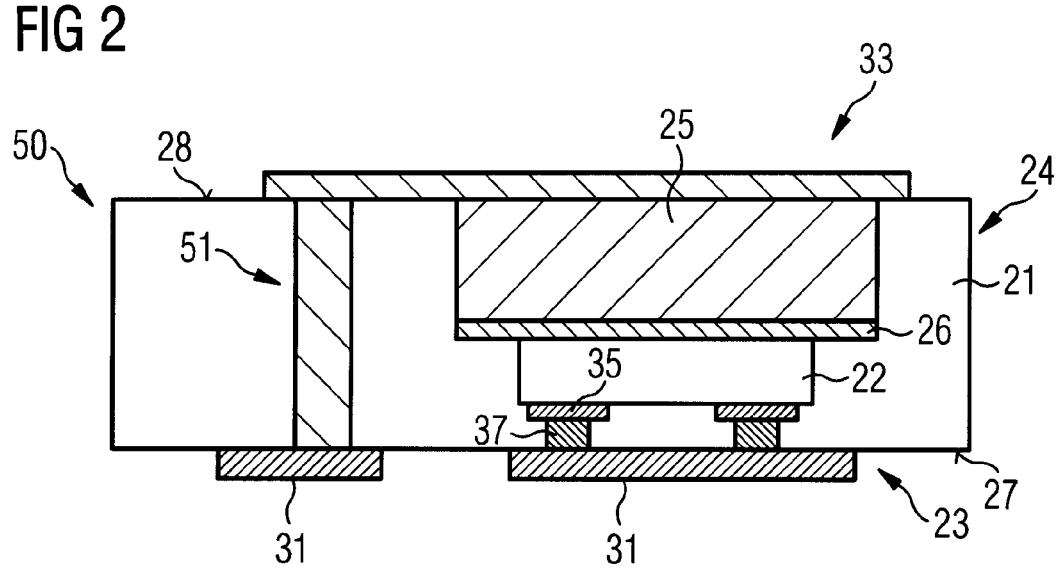
FIG. 2 illustrates an electronic component according to an embodiment.

FIG. 2 illustrates a cross-sectional view of an electronic component 50 according to an embodiment. The electronic component 50 includes a semiconductor die 22 embedded in a dielectric layer 21 and an electrically conductive member 24 including a first portion 25 including a metal foil and a second portion 26 including an electrodeposited layer comprising a second metal which is different from the first metal.

The form of the electrodeposited layer providing the second portion 26 of the electrically conductive member 24 differs from that of the conductive via 32 illustrated in FIG. 1. In the embodiment illustrated in FIG. 2, the second portion 26 has the form of a substantially planar layer which is arranged on the upper surface of the first portion 25 of the electrically conductive member 24.

In some embodiments, such as the embodiment illustrated in FIG. 2, the semiconductor die 22 is arranged on the electrically conductive member 24. In particular, the semiconductor die 22 is arranged on the second portion 26 of the electrically conductive member 24. The first portion 25 and the second portion 26 of the electrically conductive member 24 are embedded in the dielectric layer 21.

The electronic component 50 includes a first redistribution layer 23 arranged on the first surface 27 the dielectric layer 21 which includes a metal foil. Bond pads 35 of the semiconductor die 22 may be arranged directly on the first redistribution layer 23 or may be electrically coupled to the first distribution layer 23 by conductive vias 37 extending between the bond pads 35 and the first surface 29 of the first redistribution layer 23. The electronic component 50 also includes a second conductive redistribution layer 33 arranged on the second surface 28 of the dielectric layer 21 and on the first portion 25 including metal foil. The second conductive redistribution layer 33 includes an electrodeposited metal layer.

In some embodiments, the first portion 25 of the electrically conductive member 24 includes an aluminium foil, the second portion 26 includes electrodeposited copper, the second conductive redistribution layer 33 includes electrodeposited copper and the first conductive redistribution layer 23 includes copper foil. The aluminium of the first portion 25 is sandwiched between two copper layers.

The electronic component 50 may also include a conductive via 51 which extends from through the thickness of the dielectric layer 21 from the second redistribution layer 33 to the first redistribution layer 23 arranged on the opposing surface of the dielectric layer 21. The conductive via 51 may include an electrodeposited layer which is arranged on at least side walls of a through-hole in the dielectric layer 21 extending between the major surfaces 27, 28 of the dielectric layer 21. Outer surface of the first redistribution layer 23 provide the outer contact pads 31 of the electronic component 50.

FIG. 3 illustrates a flow diagram of a method which may be used to fabricate the electronic components illustrated in FIG. 1 and FIG. 2. The method makes use of a substrate which includes a foil layer and an electrodeposited layer. In particular, the foil layer acts as a support for the electrodeposited layer. The foil layer includes a first metal and the electrodeposited layer includes a second metal which is different from the first metal. The foil layer may provide the first portion 25 of the electrically conductive member 24 and the electrodeposited layer may provide the second conductive redistribution structure 33 of the electronic components 20, 50 illustrated in FIGS. 1 and 2.

Illustrated with box 61, portions of the foil layer of the substrate are selectively removed, for example to form at least one depression. Illustrated with box 62, at least one semiconductor die is applied, for example by arranging the semiconductor die in the depression or on the electrodeposited layer of the substrate. Illustrated with box 63, dielectric material is applied onto the substrate and the semiconductor die and the foil layer are embedded in the dielectric material. Illustrated with box 64, portions of the dielectric material are removed and at least one contact pad on the semiconductor die and/or a region of the foil layer adjacent the depression is exposed. For example, the contact pad may form the base of a via or through-hole extending from a major surface of the dielectric material. Similarly, the exposed region of the foil layer may form the base of a via extending from an outer surface of the dielectric material. Illustrated with box 65, conductive material is applied to the contact pad and the region of the metal foil. The conductive material may be applied to the contact pad and the region of the metal foil by electrodeposition. The conductive material may include a metal and may be introduced into the one or more vias such that a layer is formed on the walls defining the via. The via may also be filled or substantially filled with the conductive material.

The portions of the foil layer may be selectively removed by selective etching, for example selective wet etching. The depth of the depression may be controlled by adjusting the etching time, for example. In some embodiments, the foil layer may be removed completely in a particular region such that the electrodeposited layer is exposed and forms the base of the depression. In some embodiments, the foil layer is removed, such that isolated portions of the foil layer remain positioned on a continuous electrodeposited layer. The depression may be considered to be a region of the electrodeposited layer which is exposed from, and uncovered by, the remaining portions of the foil layer. The substrate may be further supported by attaching the electrodeposited layer of the substrate to a further carrier, such as a support tape.

In some embodiments, the semiconductor die may be arranged on the foil layer of the substrate. The semiconductor die may be electrically coupled to the foil layer, for example by diffusion bonding, soft solder or conductive paste. In some embodiments, the semiconductor die may be arranged directly on the electrodeposited layer of the substrate. The semiconductor die may also be electrically coupled to the electrodeposited layer by conductive adhesive. In some embodiments, the semiconductor die is electrically insulated from the underlying portion of the substrate, for example by the use of electrically insulating adhesive.

The dielectric material may be provided by a B-stageable epoxy resin which, in some embodiments, is reinforced by glass fibres. In embodiments in which the dielectric material includes glassfibre reinforced epoxy resin, the dielectric material may be pre-formed, for example by removing portions to provide one or more apertures in which the semiconductor die and, if present, other portions of the foil layer are positioned. One or more layers of dielectric material may also be applied around the side faces and a continuous layer applied on the major surface of the semiconductor die and foil layer such that the semiconductor die and remaining portions of the foil layer are surrounded by layers of the dielectric material.

The dielectric material in the B-stage may then be cured to embed the semiconductor die and portions of the foil layer within the dielectric material. The curding may take place by applying one or more of heat, pressure and UV light. The major surfaces of the semiconductor die and the foil layer may be covered by the dielectric material. In these embodiments, vias may be introduced from the outer surface of the dielectric material to expose at least a portion of the contact pads and/or regions of the foil layer with which an electrical connection should be made. Conductive material may be inserted into these vias, for example by electrodeposition or combination of physical vapour deposition, chemical vapour deposition and electrodeposition to form conductive vias.

In some embodiments, a metallic foil is placed on the dielectric material before the dielectric material is cured. In this intermediate stage, both major surfaces of the dielectric material are covered by a conductive layer. The conductive layer may be structured to provide a redistribution structure, for example the first conductive redistribution layer 23. Portions of the first conductive redistribution layer 23 may be removed when forming the vias. The first conductive redistribution layer 23 may be electrically coupled to the semiconductor die 22 and first portion 25 by the conductive material introduced into the vias.

The substrate including the foil layer and electrodeposited layer may be structured in various ways. The flow diagrams of FIGS. 4 to 6 illustrate three methods for producing the substrate.

FIG. 4 illustrates a flow diagram 70 of a method for structuring a substrate. The substrate is a multilayer substrate including a metal foil layer comprising a first metal and an electrodeposited layer arranged on the foil layer which comprises a second metal. The second metal is different from the first metal. Illustrated with box 71, a structured mask is arranged on the foil layer. The structured mass may include a photostructurable material, also known as photoresist, such as polyimide which may be structured using lithographic techniques, for example. Illustrated with box 72, a conductive layer is deposited on the portions of the foil layer which are exposed from the mask. The conductive layer may be deposited by electrodeposition. Illustrated with box 73, the mask is removed exposing portions of the foil layer. The conductive layer may be used as a hard mask during removal of the uncovered or unmasked region s of the foil layer. Illustrated with box 74, regions of the foil layer which are uncovered by the electrodeposited layer are removed to form a structured substrate having a continuous electrodeposited layer with portions of the foil arranged on the electrodeposited layer. The remaining portions of the foil layer are capped on their upper surface by the conductive layer.

A selective etching process may be used to remove these uncovered portions of the foil layer by using an etch solution which selectively etches the metallic foil layer, i.e. etches the metallic foil layer at a faster rate than the electrically conductive layer.

FIG. 5 illustrates a flow diagram 80 of a method for structuring a substrate. This embodiment may be used for a multilayer substrate including a metallic foil layer, an electrodeposited layer and a further conductive layer. The metallic foil layer is sandwiched between the electrodeposited layer and the further conductive layer. The further conductive layer may include a foil or may be an electrodeposited layer. The substrate may include a Cu/Al/Cu multilayer structure. Illustrated with box 81, a structured mask is applied to the further conductive layer. The structure mask may be a soft mask and may be formed by a photoresist, for example. The further conductive layer is selectively removed from unmasked regions of the foil, as is illustrated with box 82. Illustrated with box 83, the mask is removed such that portions of the foil layer are exposed between structured regions of the further conductive layer which are arranged on the foil layer. The further conductive layer acts as a hard mask. Exposed portions of the foil layer are selectively removed, as is illustrated with box 84, to produce a structured substrate having a continuous electrodeposited layer with portions of the foil arranged on the electrodeposited layer. The exposed portions of the foil layer may be removed by wet etching. The further conductive layer is arranged on the upper surface of the remaining portions of the foil layer.

FIG. 6 illustrates a flow diagram 90 of the method for structuring a substrate including a foil layer and a single electrodeposited layer arranged on a major surface of the foil layer. Illustrated with box 91, a mask is applied to the foil layer and unmasked regions of the foil layer are removed, for example by etching, to produce a structured foil layer arranged on the electrodeposited layer. The foil layer may be selectively etched over the electrodeposited layer. The structured foil layer may include isolated portions of the foil arranged on a continuous electrodeposited layer. Portions of the electrodeposited layer which are arranged adjacent the isolated portions of the foil layer may be uncovered. Illustrated with box 92, the mask is removed. Illustrated with box 93, a conductive layer deposited onto the remaining portions of the foil layer and exposed portions of the electrodeposited layer. In this embodiment, the remaining portions of the foil layer are coated on the side faces and upper major surface by the conductive layer. The conductive layer may be applied by electrodeposition. In the methods illustrated in FIGS. 4 and 5, only the upper major surfaces of the remaining portions of the foil layer include a further conductive layer.

When etching using a mask, underetching of the foil layer may occur which results in the remaining portions of the foil having concave side faces. The remaining or hanging portions may be removed using addition etching, if desirable.

The methods described herein to structure a substrate and to produce an electronic component are typically carried out on a panel having a number of component positions. The component positions may be arranged in rows and columns with adjacent component positions being separated by unused areas which are sometime named sawing streets. After the electronic component has been fabricated, individual electronic components may be separated or singulated from the panel.

The methods described herein may be used to manufacture an electronic component including two or more semiconductor dies. The two or more semiconductor dies may be electrically coupled by one or more of the first and second conductive redistribution layers to form a circuit or portion of a circuit. For example, two transistor devices may be coupled to form a half-bridge circuit, a High Electron Mobility Transistor (HEMT) and a MOSFET may be coupled in a cascode configuration, or a control chip including gate driver circuitry may be coupled to one or more transistors.

In some embodiments, the two or more semiconductor dies may have differing thicknesses and be arranged in the dielectric layer such that the semiconductor dies each have a major surface which is substantially coplanar. The structured substrate including foil portions and electrodeposited layer may be used to assist in arranging the major surfaces of two or more semiconductor dies of differing thickness substantially in a common plane within the dielectric layer.

FIG. 7 illustrates a cross-sectional view of an electronic component 100 which includes a first semiconductor die 101 and a second semiconductor die 102 embedded in a dielectric layer 103.

The electronic component 100 includes a plurality of conductive members 104 each including a first portion 105 including a foil including a first metal and a second portion including an electrodeposited layer 106. The electrodeposited layer includes a second metal which is different from the first metal. The first major surface 107 and side faces 108 of the first portion 105 are covered with the electrodeposited layer 106. The plurality of electrically conductive members 104 may be considered to be formed by portions of the structured foil layer which are coated on first major surface 107 and side faces 108 by an electrically deposited layer. Therefore, the electrically conductive members 104 are substantially coplanar. The first major surface 107 and side faces 108 of the electrically conductive members 104 are embedded in the dielectric material 103 and the second major surfaces 109 of the first portions 105 are substantially coplanar with the first surface 110 of the dielectric layer 103.

The first semiconductor die 101 is mounted on the electrically deposited layer 106 of the first electrically conductive member 104'. The second semiconductor die 102 is positioned between electrically conductive members 104" and 104''' such that the second major surface 111 is substantially coplanar with the second surface 109 of the metal foil of the first portions 105 and the first surface 110 of the dielectric layer 103.

The thickness of the electrically conductive members 104 may be selected such that the first major surface 112 of the first semiconductor die 101 and the first major surface 113 of the second semiconductor die 102 are substantially coplanar and arranged within the dielectric layer 103. The form and height of the electrically conductive members 104 compensates for the differing thicknesses of the semiconductor dies 101, 102 such that the thinner semiconductor die 102 is mounted on an electrically conductive member 104' whereas the thicker semiconductor die 101 is mounted in a depression between two electrically conductive members 104" and 104'''.

The lateral shape of the electrically conductive portions 104 may vary. For example, the electrically conductive member 104' may have a lateral size and shape such that the semiconductor die 101 is supported on the upper surface. The electrically conductive members 104", 104''' may be elongate or have a substantially regular lateral shape, for example, square or circular. The electrically conductive members 104", 104''' may or may not bound the entire length of the first semiconductor die 101.

The electronic component 100 includes a first conductive redistribution layer 114 arranged on the second major surface 115 of the dielectric layer 103 which includes outer portions 116 providing outer contact pads of the electronic component 100. Conductive vias 117 extend from the first conductive redistribution layer 114 to bond pads 118 arranged on the first major surface 112 of the semiconductor die 101 and between the first conductive layer 114 and bond pads 119 arranged on the first major surface 113 of the second semiconductor die 102. The conductive vias 117 may include electrodeposited metal and may include the same metal as the first conductive redistribution layer 114 and the electrodeposited layer 106 of the electrically conductive members 104. For example, the conductive vias 117, the first conductive redistribution layer 114 and the electrodeposited layer 106 may include copper.

The electronic component 100 further includes a second conductive redistribution layer 121 arranged on the first major surface 110 of the dielectric layer 103. The second conductive redistribution layer 121 includes a structured electrodeposited layer including a metal which may be the same metal as the conductive layer 106, the first redistribution layer 114 and the conductive vias 117. The second conductive redistribution layer 121 is formed from the continuous electrodeposited layer of the substrate. The second conductive redistribution layer 121 may be structured and include a first portion 122 which is arranged on and extends between the electrically conductive members 104' and 104" and a second portion 123 which extends between the rear surface 111 of the second semiconductor die 102 and the third electrically conductive member 104'''. The second redistribution layer 121 and the first redistribution layer 114 are arranged on opposing sides of the dielectric layer 103.

A conductive via 124 extends from the first surface 107 of the electrically conductive member 104''', in particular from the portion of the layer 106 arranged on the first surface 107 to the second major surface 115 of the dielectric layer 103 and electrically couples the electrically conductive member 104''' to a portion of the first redistribution layer 114. The electrically conductive member 104''' is arranged on, and is electrically coupled to, the second portion 123 of the second redistribution layer 121 and provides a through contact from the second conductive redistribution layer 121 to the first redistribution layer 114.

The rear surface 111 of the second semiconductor die 102 may be electrically coupled to the second redistribution layer 123 by a conductive adhesive or diffusion solder or soft solder 125 such that the rear surface 111 of the first semiconductor die 102 is electrically coupled by means of the second portion 123 of the second redistribution layer 121 and the electrically conductive member 104''' to the first conductive redistribution layer 114.

The first semiconductor die 101 may be mounted on, and electrically coupled to, the first electrically conductive member 104' by a soft solder or diffusion solder bond 126. The rear surface 127 of the semiconductor die 101 may also be electrically coupled to the first conductive redistribution layer 114 by way of the first electrically conductive member 104', the portion 122 of the second redistribution layer 121, the second electrically conductive member 104" and a further conductive via which extends between the second conductive redistribution structure 121 and the first conductive redistribution 114 which cannot be seen in the cross-sectional view of FIG. 7.

The first semiconductor die 101 may be a transistor device, such as a vertical MOSFET which includes a first current electrode and a control electrode on its first major surface 112 and second current electrode on the second major surface 127. The second semiconductor die 102 may include control circuitry and may be electrically coupled to the first semiconductor die 101 by portions of one or both of the first conductive redistribution layer 114 and the second redistribution conductive redistribution layer 121. The semiconductor die 102 may include a gate driver circuitry for switching the first semiconductor die 101, for example.

In other embodiments, the first semiconductor die 101 may be a silicon-based MOSFET device and the second semiconductor die 102 may include a compound semiconductor device, such as a Group III-nitride based transistor such as a HEMI. Additionally, the electronic component 100 may include a further control semiconductor die.

The electronic component is not limited to including two semiconductor devices but may also include more than two semiconductor dies. For example, the electronic component 100 may include two transistor devices configured to provide a half bridge circuit and a control semiconductor die for switching the transistor devices.

The first portions 105 of the plurality of electrically conductive members 104 and the structured portions 122, 123 of the second conductive redistribution layer 121 may be formed from a substrate including a continuous metallic foil supporting a continuous electrodeposited layer. The foil is structured to produce the first portions 105 supported on the electrodeposited layer. The electrodeposited layer 106 is deposited onto the first portions 105. The semiconductor dies 101, 102 and the electrically conductive members 104 are embedded in the dielectric layer 103 and the semiconductor dies 101, 102 and portions of the electrically conductive members 104 are electrically coupled to the first redistribution layer 114 deposited on the first major surface 115 of the dielectric layer 105. The second continuous electrically electrodeposited layer may be structured to form the second redistribution layer 121. Therefore, of the original substrate, portions of the metal foil layer are embedded within the dielectric layer 103 and the electrodeposited layer, which was supported by the foil layer, is arranged on first major surface 110 of the dielectric layer 103 and forms the second redistribution layer 121.

Figure 8:
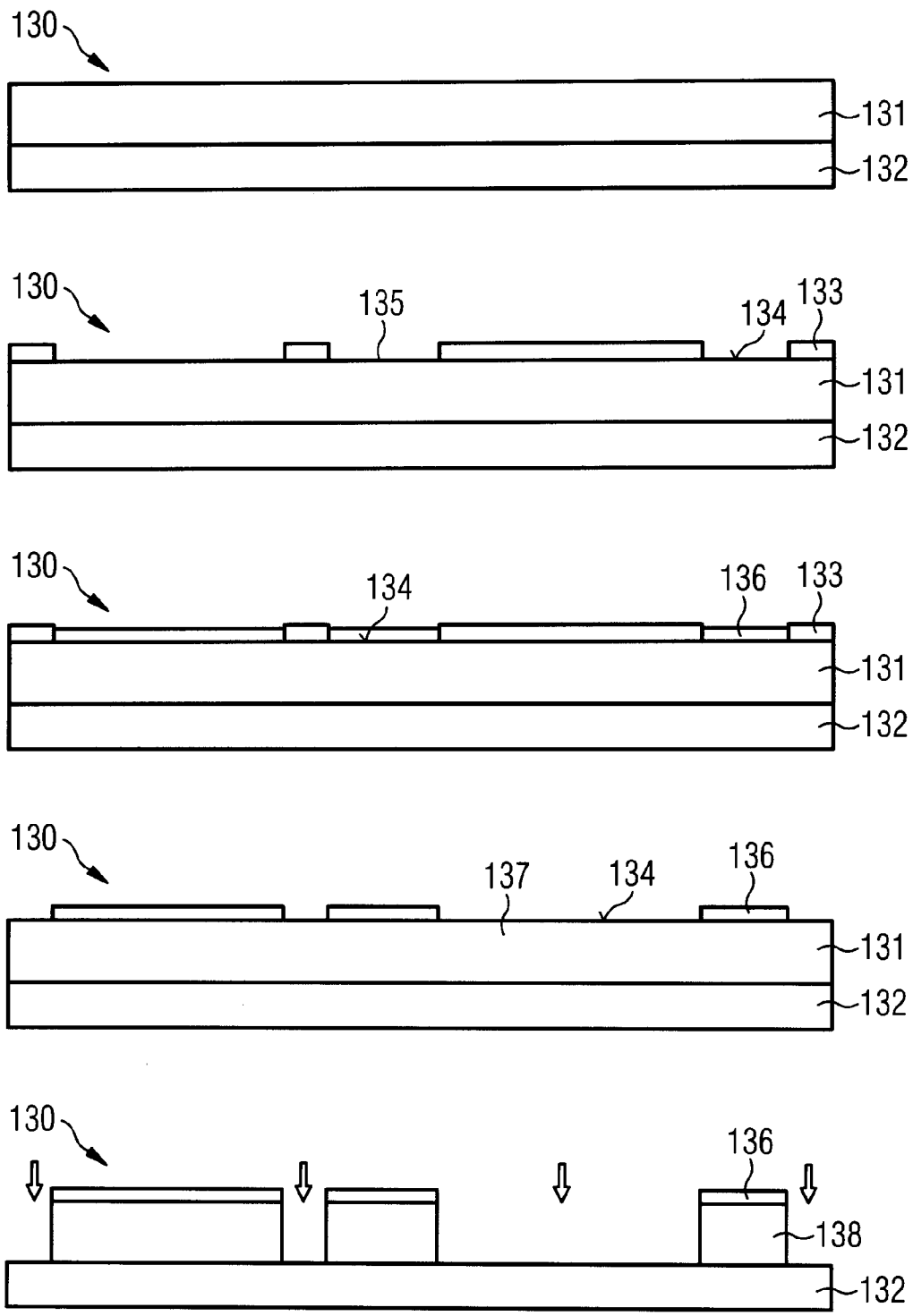
FIG. 8 illustrates a method of fabricating a substrate for an electronic component according to an embodiment.

FIGS. 8 to 10 illustrate methods for structuring a substrate which may be used to produce the electronic component of any of the embodiments described herein. In FIGS. 8 to 10 a single component position is illustrated. However, in practice the substrate includes many component positions which are processed to produce a panel including many electronic components.

FIG. 8 illustrates a substrate 130 which includes a metal foil 131 and an electrodeposited layer 132. The substrate 130 may be considered as a multi-layered substrate in which the foil 131 acts as a support and carrier for the electrodeposited layer 132. The substrate 130 may also be used as a source of a continuous electrodeposited layer 132 by removing the metal foil layer 131. However, as used herein, the metal foil layer 131 provides portions of the final electronic component and is embedded in the dielectric layer of the final electronic component.

The substrate 130 may include an aluminium foil layer 131 having a thickness of to 1 mm. In some embodiments, the aluminium foil layer 131 has a thickness of 20 µm to 200 µm with an electrodeposited copper layer 132 having a thickness of 2 µm to 85 µm may be used. In some embodiments, the aluminium foil 131 may have a thickness of 30 µm to 40 µm and the electrodeposited copper layer 132 a thickness of 2 µm to 9 µm. The electrodeposited copper layer 132 may have a purity of around 99.8%.

The substrate 130 is structured by removing portions of the foil layer 131. In the embodiment illustrated in FIG. 8, a mask 133 is applied to an outermost surface 134 of the foil layer 131. The mask 133 may include a photostructurable material such as polyimide and is structured such that regions 135 of the metal foil layer 130 remain uncovered by the mask 133. A conductive layer 136 is applied to the uncovered regions 135 of the metal foil layer 131 defined by the mask 133. The conductive layer may be applied using an electrodeposition technique. The mask 133 is removed such that portions of the conductive layer 136 remain on the outermost surface 134 of the metal foil layer 131.

The remaining portions of the conductive layer 136 are used as a hard mask. Portions 137 of the metal foil layer 131 which are uncovered by the structured portions 136 of the conductive layer arranged on first major surface 134 are removed, for example using a selective etching process. Portions of the electrodeposited layer 132 may be exposed such as isolated regions 138 of the foil layer 131 are supported on and coupled by the continuous electrodeposited layer 132.

The composition of the foil layer 131, the electrodeposited layer 132 and the conductive layer 136 may be chosen such that selective etching of the material providing the foil layer over the material of the electrodeposited layers 132, 136 can be performed.

In embodiments in which the metal foil layer 131 includes aluminium, the layers 132, 136 may include copper. An alkaline copper solution may be used to electrodeposit the layer 136 directly on the surface 134 of the aluminium foil 130 and a solution comprising NaOH may be used to selectively etch which exposed portions 137 of the metal foil layer 131.

In some embodiments, the interface between the metal foil layer 131 and the electrodeposited layer 132 of the substrate 130 may act as an etch stop. For example, an additional etch stop layer may be provided at the interface.

FIG. 9 illustrates a method of structuring the substrate 130' according to a second embodiment. The starting material 130' includes a metal foil layer 131 and electrodeposited layer 132 as in the embodiment illustrated in FIG. 8. The substrate 130' further includes an additional metal layer 140 arranged on the surface 134 of the metal foil layer 131 such the metal such that the metal foil layer 131 is sandwiched between two further layers 132, 140. The metal layer 140 may include a metal foil bonded to the foil layer 131 or may include an electrodeposited layer. The additional layer 140 may include a different metal to the metal foil 131 and may include the same metal as the electrodeposited layer 132. In some embodiments, the metal foil 131 includes aluminium and the electrodeposited layer 132 and the additional conductive layer 140 include copper.

A mask 141 is applied to the additional metal layer 140. The mask 141 may include a photostructurable material. The mask 141 is the negative of the mask 133 illustrated in FIG. 8 and defines the portions of the metal foil layer 131 which are to remain and which are to form part of the electronic component.

Regions of the metal layer 140 which remain uncovered from the mask 141 are removed to expose portions of the surface 134 of the metal foil 131. The mask 141 may be removed and the remaining portions of the additional layer 140 used as a hard mask. Portions of the metal layer 131 which remain uncovered from the structured layer 140 are removed, for example, by selective etching. As a result, portions 138 including the metal foil layer 131 and the additional layer 140 remain attached to the continuous electrodeposited layer 132.

FIG. 10 illustrates a method for structuring the metal foil 130 in which a mask 150 is applied directly to an outermost surface 134 of the metal layer 131 and portions of the metal foil layer which remain exposed from the mask 150 are removed, for example, by etching. The mask 150 may include photostructurable material. The interface 137 between the metal foil layer 131 and the electrodeposited layer 132 act as an edge stop such that isolated portions 138 of the metal layer 131 remain attached to a continuous electrodeposited layer 132. The structured substrate may be used in this form without further processing. In some embodiments, a layer 151 is applied to the upper major surfaces 152 and side faces 153 of the remaining portions of the metal layer 131 and onto the exposed portions of the electrodeposited layer 132. The layer 151 may be considered to be applied conformally to the substrate. The layer 151 may be applied using an electrodeposition technique.

This embodiment may be used to provide a structure in which all of the outermost surfaces of the remaining portions of the metal foil layer are covered by a copper layer. Use of a closed continuous copper layer enables a standard roughening technique to be used to encourage good adhesion between the metallic portions 138 of the electronic component, including the portions of the metal foil layer and the dielectric layer. A typical roughening treatment may include grain boundary etching.

In this embodiment, selective etching removes the material of the foil, in this embodiment Al, at a faster rate than the material of the layer, in this embodiment, Cu. In particular, the difference in the etching rate may be in the range of 1.5:1 to 100:1. A suitable etch for this combination of materials includes NaOH.

The processes described herein, such as those described in connection with FIGS. 8 to 10, are not limited for use to produce one or more electronic components including two semiconductor dies. The processes may also be used to fabricate an electronic component with a single semiconductor die, such as that illustrated in FIGS. 1 and 2, or an electronic component including three or more semiconductor dies.

FIGS. 11 and 12 illustrated the fabrication of an electronic component. A single component position is illustrated. However, in practice, the processes may be carried out on many component positions arranged on the substrate.

FIG. 11 illustrates the fabrication of an electronic component including two semiconductor dies of differing thickness.

A substrate 160 is provided which includes an electrodeposited layer 161 and one or more portions 162, 163, 164 of a foil which are arranged on the first major surface 165 of the electrodeposited layer 161. The portions 162, 163, 163 of the foil include a first metal and the electrodeposited layer 161 includes a second metal which is different from the first metal. For example, the first metal may be aluminium and the second metal may be copper. At least the upper surface 166 of each of the portions 162, 163, 164 includes a further metallic layer 167. The further metallic layer 167 may be an electrodeposited layer and may include the same metal as the electrodeposited layer 161. One of the methods disclosed in connection with FIGS. 3 to 6 and FIGS. 8 to 10 may be used to form the substrate 160.

The portions 162, 163, 164 of the foil may have different lateral sizes and shapes. For example, one or more of the portions may be sized and shaped to support a semiconductor die and one or more portions may be sized and shaped to provide a portion of a through contact. The through contact may be laterally substantially circular, square, rectangular or elliptical, for example. The portions may each have substantially the same height since the portions were formed from a common foil.

A first semiconductor die 168 is arranged directly on a first major surface 165 of the electrodeposited layer 161 and is positioned between two portions 163, 164 including the foil. The semiconductor die 168 may be attached to the electrodeposited layer 161 by a layer of conductive adhesive 169. The semiconductor die 168 has a thickness such that its upper surface 170 is arranged in a plane above the plane of the metallic layer 167.

A second semiconductor die 171 is mounted on the first portion 162 of the metal foil and, in particular, on the metallic layer 167 arranged on the upper surface 166 of the first portion 162 of the metal foil. The semiconductor die 171 may include a contact pad 172 on its rear surface which is electrically coupled to the first portion 162 by an electrically conductive bond 173. The conductive layer 173 may be a soft solder bond, conductive adhesive bond or a diffusion solder bond, for example. The semiconductor die 171 also includes one or more contact pads 174 on its upper surface 175. The upper surface 175 of the semiconductor die 171 is substantially coplanar with the upper surface 170 of the first semiconductor die 168.

The first semiconductor die 168, the second semiconductor die 171 and the portions 162, 163, 164 of the metal foil are then embedded in a dielectric material. The dielectric material may be applied in the form of one or more layers 176, 177. The layers 176, 177 may include sheets of B-stagable glassfibre reinforced epoxy resin, also known as pre-preg. One or more of the layers 176 may include may include apertures 180 having a lateral size adapted to accommodate the semiconductor dies 168, 171 and portion 162 of the metallic layer 167. Depending on the thickness of the semiconductor dies 168, 171 and the thickness of the dielectric layer 176, two or more layers 176 with apertures may be used to fill the region and volume between the portions 162, 163, 164 and side faces of the semiconductor dies 168, 171. A further continuous layer 177 may be applied over the upper surfaces 170, 175 of the semiconductor dies 168, 171, respectively. A further metallic layer 178 may be applied to the continuous dielectric layer 177. The metallic layer 178 may be applied in the form of a foil, such as a copper foil.

The metallic layer 178 may be provided as part of a pre-fabricated dielectric material. For example, the metallic layer 178 and the dielectric layer 177 may be provided by RCC resin coated copper foil or other pre-fabricated resin coated metal foil. The metal foil may include a resin layer arranged on only one major surface.

The assembly is treated to cure the B-stageable dielectric material and to embed the semiconductor dies 168, 171 and the portions 162, 163, 164 within a common dielectric layer 184 formed from the dielectric material provided by the layers 176, 177 and to adhere the metallic layer 178 to the outermost surface 179 of the dielectric layer 184.

Vias are introduced through the metallic layer 178 to expose bond pads 174, 181 on the upper surfaces 175, 170 of the semiconductor dies 168, 171. Conductive material is introduced into the vias to produce a conductive via 182 which electrically couples the semiconductor dies 168, 171 to the metallic layer 178. The metallic layer 178 may be structured to produce a first redistribution layer and the desired lateral connections between the two semiconductor dies 168, 171 and provide an arrangement of outer contact surfaces forming to a desired footprint.

A via may also be introduced through the conductive layer 178 and upper surface 179 of the dielectric layer 184 to expose a region of the third portion 164 of the conductive layer 167 arranged on the upper surface 166 of the third portion 164. Conductive material is introduced into the via to produce a conductive via 183 which electrically couples the third portion 164 to the metallic layer 178 arranged on the upper surface 179 of the dielectric layer 184. The third portion 164 and conductive via 183 provide a through contact through the thickness of the dielectric layer 184. The conductive layer 161 may be structured to produce two or more portions and to provide a second conductive redistribution layer 185 on the second major surface 186 of the dielectric layer 180. The electrodeposited layer 161 may be structured by applying a mask 187 and etching regions of the electrodeposited layer 161, for example.

The second conductive redistribution layer 185 may be used to provide a redistribution structure for one or more contact pads arranged on the rear surfaces of one or more semiconductor chips 168, 171. The second conductive redistribution layer 185 may also be used to electrically couple the one or more contact pads arranged on the rear surface to the first redistribution layer 178 arranged on the opposing surface of the dielectric layer 184.

The height of the portions 162, 163, 164 may be selected such that the upper surfaces of two or more semiconductor dies are substantially coplanar when the thicker semiconductor device is mounted directly on the electrodeposited layer. This may be used to simplify the production of conductive vias from the upper surfaces of the semiconductor dies to an outer surface of the dielectric layer in which the semiconductor dies are embedded.

The first semiconductor die 171 may be a vertical device, such as a vertical transistor in which at least one current electrode is arranged on opposing surfaces of the semiconductor body so that the device has a vertical current path. In other embodiments, the semiconductor device 171 may include a ground contact pad on its rear surface, or may include a lateral device with a lateral current path or a quasi-vertical device. The first semiconductor die 168 may be include control circuitry for controlling one or more further semiconductor devices within the electronic component, such as the second semiconductor device 171.

In some embodiments, the semiconductor die 168 includes a Group III nitride based HEMT and the semiconductor die 171 is a silicon based transistor device, such as a MOSFET. The HEMT and the MOSFET may be coupled in a cascode configuration, for example, by one or more conductive redistribution structures arranged on one or more major surfaces of the dielectric layer 184.

The arrangement of the portions 162, 163, 164 of the metal foil, the electrically conductive layer 161 forming the second redistribution structure 185, the dielectric layer and first redistribution structure 178 may also be used for electronic components in which at least two semiconductor dies have the same thickness or height.

FIG. 12 illustrates an electronic component 190 including a first semiconductor die 191 and a second semiconductor die 192 which have substantially the same thickness.

The semiconductor dies 191, 192 are mounted on portions of an electrodeposited metal layer 193 which is arranged on a lower surface 194 of a dielectric layer 195 in which the semiconductor dies 191, 192 are embedded. The electrodeposited layer 195 may be structured to provide a second redistribution layer 206. The electronic component 190 also includes one or more portions 196 of a metal foil which are embedded in the dielectric layer 195. The lower surface 197 of the portions 196 of the metallic foil is substantially coplanar with the lower surface 194 of the dielectric layer 195 and may form an interface with portions of the electrodeposited layer 193. The upper surface of the portions 196 may include a conductive layer 198 comprising different metal. The layer 198 may include an electrodeposited metal. The electrodeposited layer 193 and the layer 198 may include copper and the portions 196 of the metal foil may include aluminium.

One of the methods disclosed in connection with FIGS. 3 to 6 and FIGS. 8 to 10 may be used to form portions 196 of metal foil and the electrodeposited metal layer 193.

One or more of the portions 201 of the metal foil may form part of a through contact 199 extending from the lower surface 194 of the dielectric layer 195 to the upper surface 200 of the dielectric layer 195. The electronic component 190 also includes a first conductive redistribution layer 202 arranged on the upper surface 200 of the dielectric layer 195 and which is electrically coupled to the semiconductor dies 191, 192 by conductive vias 203 which extend from the first conductive redistribution layer 202 arranged on the upper surface 200 of the dielectric layer 195 to contact pads 204 arranged on the first major surface 211 of the semiconductor dies 191, 192. The though contact 199 also includes a conductive via 205 which extends from the first conductive redistribution layer 202 to the layer 198 arranged on the portion 201 of the metal foil.

In this embodiment, the metal foil of the portions 196 serves to decrease the thickness of the dielectric layer 195 through which the conductive via 205 extends in comparison to an arrangement in which the conductive via extends throughout the thickness of the dielectric layer 195. By decreasing the height of the conductive via 205, the conductive via may be more accurately positioned and the dimensions of the conductive via 205 may be more accurately determined.

The semiconductor dies 191, 192 may be transistor devices which are configured to form a particular circuit, such as a half bridge circuit by means of the first redistribution layer 202 and the second redistribution layer 206. The through contact 199 provides a redistribution structure for a contact pad 207 arranged on the lower surface 208 of the semiconductor die 192. A contact pad 209 arranged on the rear surface 210 of the semiconductor die 191 may also be electrically coupled to the redistribution layer 201 arranged on the opposing surface of the dielectric layer 195 by an electrically conductive member or through contact which is not illustrated in the cross-sectional view of FIG. 12. Similarly, the further portions of the foil layer may also be electrically coupled to one or more of the first conductive redistribution structure 201 and the second redistribution structure 206 by conductive vias which cannot be seen in the cross-sectional view of FIG. 12.

In embodiments, in which a back side electrical connection is not required for one or more of the semiconductor dies, the connection between the back side of the semiconductor die and the underlying metallic layer may be made by a non-electrically conductive or isolative adhesive.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
a dielectric layer comprising a first surface and a second surface;
one or more semiconductor dies embedded in the dielectric layer; and
at least one electrically conductive member comprising a first portion and a second portion, the first portion comprising a foil layer comprising a first metal and the second portion comprising an electrodeposited layer comprising a second metal, wherein the first portion and the second portion are embedded in the dielectric layer.

2. The electronic component according to claim 1, further comprising a first conductive redistribution layer comprising a first surface arranged on the first surface of the dielectric layer and a second surface providing at least one outer contact.

3. The electronic component according to claim 2, further comprising a second conductive redistribution layer arranged on the second surface of the dielectric layer and comprising an electrodeposited metal, the first portion of the electrically conductive member being arranged on and electrically coupled to the second redistribution layer.

4. The electronic component according to claim 3, wherein the electrically conductive member extends between the first redistribution layer and the second redistribution layer.

5. The electronic component according to claim 3, wherein the first conductive member extends between the second redistribution layer and a semiconductor die.

6. The electronic component according to claim 1, wherein the electrically conductive member further comprises an interface layer arranged between the first portion and the second portion.

7. The electronic component according to claim 6, wherein the interface layer is arranged on the upper surface of the first portion.

8. The electronic component according to claim 6, wherein the interface layer is arranged on the upper surface and side faces of the first portion.

9. The electronic component according to claim 1, wherein the electronic component comprises two or more semiconductor dies each comprising a major surface that is substantially coplanar.

10. The electronic component according to claim 9, wherein the two or more semiconductor dies have different thicknesses.

11. The electronic component according to claim 9, wherein a first semiconductor die is arranged on a second redistribution layer and a second semiconductor die is arranged on the electrically conductive member.

12. A method of fabricating an electronic component, the method comprising:
selectively removing portions of a foil layer of a multilayer substrate, the multilayer substrate comprising the foil layer comprising a first metal and an electrodeposited layer comprising a second metal;
arranging at least one semiconductor die on the multilayer substrate;
applying dielectric material onto the multilayer substrate and embedding the semiconductor die and the foil layer in the dielectric material;
removing portions of the dielectric material and exposing at least one contact pad of the semiconductor die and a region of the foil layer adjacent a depression in the foil layer; and
applying conductive material to the contact pad and a region of a metal foil.

13. The method according to claim 12, further comprising applying a metal layer to a first surface of the dielectric material and removing portions of the metal layer to produce a first redistribution structure on the first surface of the dielectric material.

14. The method according to claim 12, further comprising removing portions of the electrodeposited layer and forming a second redistribution structure on a second surface of the dielectric material.

15. The method according to claim 12, wherein the portions of the foil layer are removed by selective etching.

16. The method according to claim 12, further comprising arranging a mask on the foil layer and removing portions of the foil layer exposed from the mask.

17. The method according to claim 16, further comprising applying an interface layer to portions of the foil layer exposed from the mask and, afterwards, removing the mask.

18. The method according to claim 16, further comprising removing the mask and, afterwards, applying an interface layer to the surface of the foil layer.

19. The method according to claim 12, wherein arranging the semiconductor die on the multilayer substrate comprises arranging the semiconductor die on a portion of the foil layer.

20. The method according to claim 12, wherein arranging the semiconductor die on the multilayer substrate comprises arranging the semiconductor die on the electrodeposited layer.

* * * * *

UNITED STATES PATENT AND TRADEMARK OFFICE
CERTIFICATE OF CORRECTION

| | | |
|---|---|---|
| PATENT NO. | : 9,553,051 B2 | Page 1 of 1 |
| APPLICATION NO. | : 14/611676 | |
| DATED | : January 24, 2017 | |
| INVENTOR(S) | : P. Palm et al. | |

It is certified that error appears in the above-identified patent and that said Letters Patent is hereby corrected as shown below:

On the Title Page

Second Column, (74), please change "Muphy" to --Murphy--.

Signed and Sealed this
Eleventh Day of April, 2017

Michelle K. Lee
*Director of the United States Patent and Trademark Office*